United States Patent
Notzel

(10) Patent No.: US 10,178,466 B2
(45) Date of Patent: Jan. 8, 2019

(54) POWERED SPEAKER SYSTEM AND METHOD

(71) Applicant: Komet Amplification Group, LLC, Baton Rouge, LA (US)

(72) Inventor: Holger Notzel, Baton Rouge, LA (US)

(73) Assignee: KOMET AMPLIFICATION GROUP, LLC, Baton Rouge, LA (US)

( * ) Notice: Subject to any disclaimer, the term of this patent is extended or adjusted under 35 U.S.C. 154(b) by 0 days.

(21) Appl. No.: 15/872,894

(22) Filed: Jan. 16, 2018

(65) Prior Publication Data

US 2018/0206026 A1    Jul. 19, 2018

Related U.S. Application Data

(60) Provisional application No. 62/446,120, filed on Jan. 13, 2017.

(51) Int. Cl.
| | |
|---|---|
| *H04R 1/02* | (2006.01) |
| *H04R 1/24* | (2006.01) |
| *H03G 3/04* | (2006.01) |
| *H04R 3/14* | (2006.01) |

(52) U.S. Cl.
CPC ............ *H04R 1/24* (2013.01); *H03G 3/04* (2013.01); *H04R 1/025* (2013.01); *H04R 3/14* (2013.01); *H04R 2201/028* (2013.01)

(58) Field of Classification Search
CPC . H04R 1/24; H04R 1/025; H04R 3/14; H04R 2201/028; H03G 3/04
See application file for complete search history.

(56) References Cited

U.S. PATENT DOCUMENTS

| | | | | |
|---|---|---|---|---|
| 6,111,961 A | * | 8/2000 | Hedrick | G10H 3/186 381/120 |
| 2008/0013759 A1 | * | 1/2008 | Baird | H04R 5/04 381/123 |
| 2014/0290469 A1 | * | 10/2014 | Michaud | G10H 1/0091 84/741 |

FOREIGN PATENT DOCUMENTS

| | | |
|---|---|---|
| EP | 2107822 | 10/2009 |
| GB | 2516926 | 2/2015 |

* cited by examiner

*Primary Examiner* — Andrew L Sniezek
(74) *Attorney, Agent, or Firm* — Leason Ellis LLP

(57) ABSTRACT

A powered speaker system comprising a cabinet and an input to receive an audio signal from an external amplifier. An audio splitter receives and splits the audio signal into first and second portions. At least one first speaker driver receives the first portion of the split audio signal, and an effects output jack receives the second portion. An effects input jack that is connectable to the external effects device, receives the second portion of signal that is modified by the external effects device. An internal amplifier is coupled to the effects input jack and receives and amplifies the modified second portion of the signal. At least one second speaker driver receives from the internal amplifier, the amplified modified second portion. The first speaker driver outputs the first portion simultaneously while the second speaker driver outputs the amplified modified second portion of the split audio signal.

11 Claims, 6 Drawing Sheets

POWERED SPEAKER SYSTEM AND METHOD

CROSS-REFERENCE TO RELATED PATENT APPLICATIONS

This application is based on and claims priority to U.S. Provisional Patent Application 62/446,120, filed Jan. 13, 2017, the entire contents of which is incorporated by reference herein as if expressly set forth in its respective entirety herein.

FIELD

The present application relates, generally, to a powered speaker system and, more particularly, to a system and method for producing wet/dry/wet audio signals in a closed access speaker system.

BACKGROUND

Players of electric musical instruments, notably electric guitars, strive to obtain particular tonal qualities from their instruments. For example, guitar players often overdrive amplifiers to achieve harmonic distortion, which is desirable in various musical contexts. Generally, such distortion can be generated by overloading an audio signal in a preamplifier ("preamp distortion") and, thereafter, amplifying the distorted audio signal simply to make it louder and without further affecting its tone. In addition (or in the alternative), distortion can be generated by overloading a signal in the amplifier itself ("power amp distortion"), as opposed to the preamplifier. Power amp distortion usually requires an extremely high volume level to be achieved, and thus is not as practical for many players as preamp distortion, which can generate distortion at a low volume. Despite the practical limitations, power amp distortion is often considered more desirable, as it produces tonal qualities having a greater dynamic range and can be controlled more effectively than preamp distortion by the player, such as by using various playing techniques. Guitar players often prefer power amp distortion for being more "responsive" or "touch sensitive" than preamp distortion. Further, most vintage (e.g., tube) guitar amplifiers produce only power amp distortion, and players prefer the sounds that such devices produce over more recent or modern guitar amplifiers, which rely largely or exclusively on preamp and/or digitally produced distortion.

In addition to the sounds produced by preamp distortion and power amp distortion, players of electric guitars and other electric instruments employ devices to produce other sound effects to alter tones and sounds that emanate from their instruments. Referred to herein generally as "wet effects," these devices can include signal boosters, distortion devices and equalizers, and are designed to receive a line level output signal from an instrument (e.g., guitar output) and send a modified line level signal to the input of the amplifier. Wet effects can further be classified as "time-based" effects, and produce reverb (e.g., echo), delay (e.g., repeating), pitch alteration, and other sound qualities that are not intended to alter the basic sound of an amplifier, but to add sound-based functionality to an amplifier. For example, a wet effects unit can produce reverb for a vintage amplifier that is not configured with that effect. Wet effects can be provided in analog and/or digital devices, and can be configured in various formats, such as foot pedals, hand-held devices (including mobile computing devices), or in rack-mount devices that can include rocker switches, push buttons, knobs, slider controls and/or other controls.

Many players of electric instruments believe that the order in which various effects are connected, such as "in front of" or "behind" an amplifier greatly affects tonal quality. For example, some wet effect units should not receive a signal from the instrument to provide a reverb effect as input to the amplifier. A signal producing reverb, for example, is believed to suffer in tonal quality when it is overdriven in the amplifier or subjected to power amp distortion. It is often preferred for an audio signal to be overdriven (i.e. distorted) and, thereafter, shaped to include reverb, delay or other wet effect.

Some musical instrument amplifiers are configured with a preamplifier and amplifier, and often include wet effects that are positioned between the preamplifier and the power amplifier. Referred to, generally, as an "effects loop," such amplifiers are configured such that the wet effects operate on audio signals that are distorted via preamp distortion, and made louder by the amplifier. Other musical instrument amplifiers are not so configured, and may not work well with effects loops because the time-based effects are positioned after the preamplifier, and the audio signals processed by wet effects get further distorted as the power amplifier is overdriven (i.e., by power amp distortion).

SUMMARY

In accordance with one or more implementations, a powered speaker system is disclosed comprising a cabinet and an input, configured in the cabinet and accessible to a user, to receive an audio signal from an external amplifier that is not configured in the cabinet. An audio splitter, that is configured in the cabinet, receives and splits the audio signal from the external amplifier into first and second portions. Moreover, at least one first speaker driver, configured in the cabinet, receives the first portion of the split audio signal from the audio splitter, and an effects output jack, configured in the cabinet, receives from the audio splitter the second portion of the split audio signal and is connectable to an external effects device. The powered speaker system further includes an effects input jack, configured in the cabinet, that is connectable to the external effects device, and that receives, from the external effects device, the second portion of the split audio signal that is modified by the external effects device. The powered speaker system includes an internal amplifier, configured in the cabinet, that is coupled to the effects input jack and that receives and amplifies the modified second portion of the split audio signal, and at least one second speaker driver, configured in the closed cabinet receives from the internal amplifier, the amplified modified second portion of the split audio signal. The first speaker driver of the powered speaker system outputs the first portion of the split audio signal simultaneously while the second speaker driver of the power speaker system outputs the amplified modified second portion of the split audio signal.

Other features and advantages of the present invention will become apparent from the following description of the invention that refers to the accompanying drawings.

BRIEF DESCRIPTION OF THE DRAWINGS

Aspects of the present disclosure will be more readily appreciated upon review of the detailed description of its various embodiments, described below, when taken in conjunction with the accompanying drawings, of which.

DESCRIPTION

Figure 1:
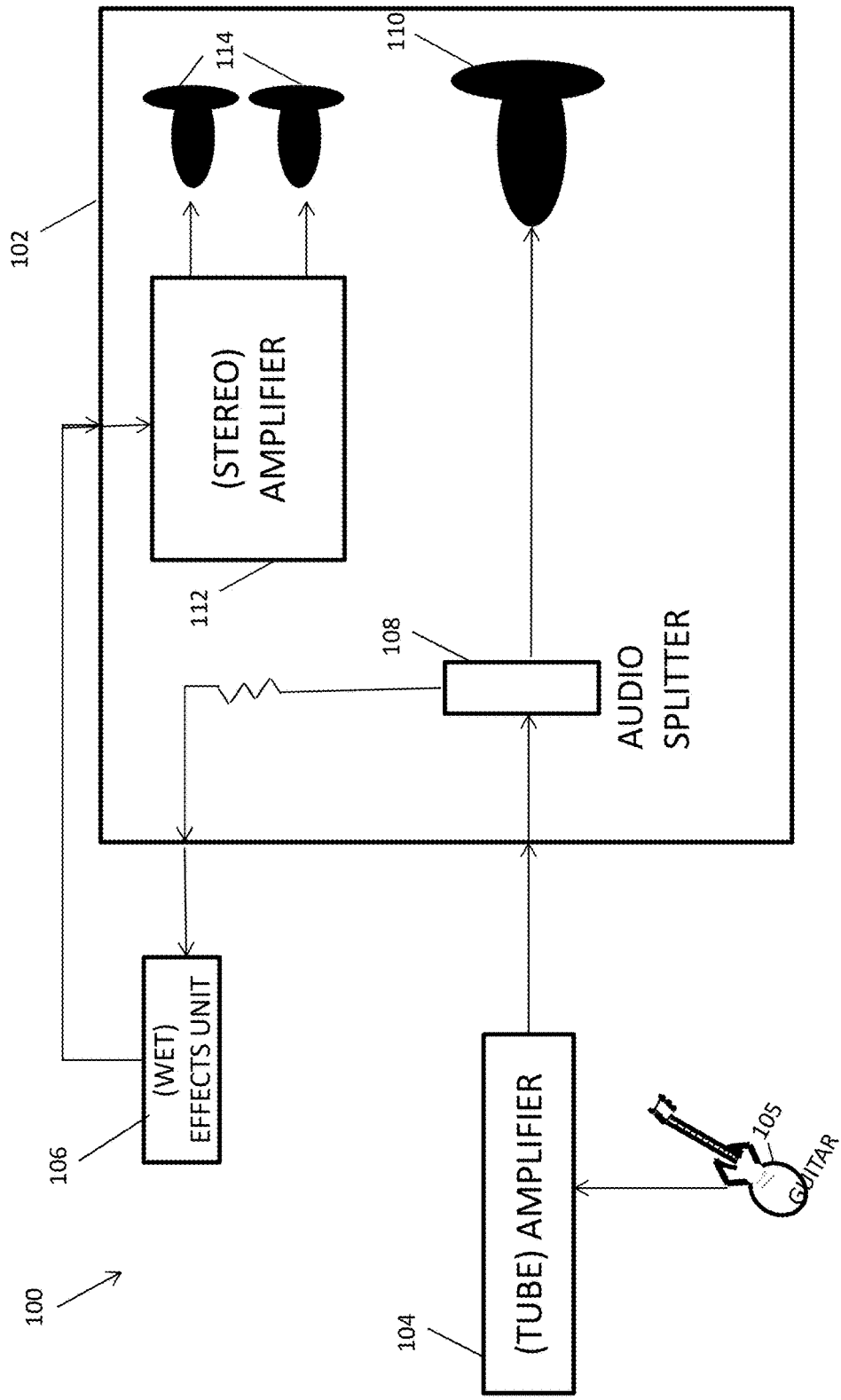
FIG. 1 is a block diagram illustrating an arrangement, including a powered speaker system in accordance with the present application.

By way of overview and introduction, the present application includes, in one or more implementations, a powered speaker system configured in a speaker cabinet that outputs a "dry" (native amplifier) audio signal to one or more speakers and a wet (effects processed) audio signal to one or more other speakers, via a single bodied system. In operation, the powered speaker system of the present application applies ambient, time-based effects that are provided simultaneously with output from an amplifier's dry sound, without degrading the amplifier's sound in any way. For example, in case an electric guitarist desires a high quality "grunge" sound, a portion of an overdriven (power amp distorted) audio signal is output effectively via a pass-thru first audio channel, and wet effects are applied to another portion of the dry (overdriven) signal via a second audio channel. The two channels can be mixed separately, thereafter, and output by the powered speaker system, which produces a rich, high quality sound that includes the amplifier's native tonal qualities.

More particularly, in one or more implementations, a dry output signal from a musical instrument amplifier is received by the powered speaker system of the present application. The received signal may have been subjected to power amp distortion or not, depending upon the desires of the player during use. Regardless, the output (dry signal) from the amplifier is received by an input of the powered speaker system, and the received dry signal from the amplifier is split into two or more portions as a function of circuitry configured within the powered speaker system. The technology that operates to split the dry audio signal into two portions can be provided within the powered speaker system of the present application and is not user accessible. As used herein, "user accessible" refers, generally, to components and/or features of the powered speaker system that are accessible during normal use, and without requiring tools or devices (e.g., screwdrivers, pliers or other tools) for user access. A volume control, input jack or other feature of the powered speaker system is considered "user accessible." Circuitry, speaker drivers, fuses, or the like that are contained within the powered speaker system are considered not user accessible. In one or more implementations, at least some components and/or features of the powered speaker system are not user accessible, while in one or more other implementations, such components/features are user accessible.

One of the split-off portions of the dry signal can be sent to an output jack (e.g., a ¼" jack) configured within the powered speaker system. The output jack can be used to connect to an input of a wet effects unit, which can receive the dry signal for effects processing, such as to provide reverb, delay, pitch alteration or other suitable wet effect. An output signal from the wet effects unit can, thereafter, be received via an input jack configured within the powered speaker system. By connecting the output of the effects unit to an input of the powered speaker system, the dry signal processed by the effects unit (now a "wet" signal) gets fed back into the powered speaker system, and received by a power (e.g., stereo) amplifier configured within the powered speaker system of the present application. The stereo amplifier is configured to send the wet signal to one or more dedicated speakers configured within the powered speaker system. Although examples and discussions herein relate to a stereo amplifier, the powered speaker system of the present application can instead include a monaural amplifier. In addition, a monaural (or "mono") output can be provided via the present application, in which a single audio signal is sent to one or more speaker drivers, or in which stereo channels are bridged to produce a mono output.

In one or more implementations, the powered speaker system of the present application features an output send line level control(s) to accommodate a variety of features, from floor pedals to studio quality rack units. Furthermore, one or more volume level controls can be configured with the powered speaker system for controlling the output proportion of a wet effects signal from the internal stereo amplifier. This provides for extreme user customization for mixing the wet signal from the internal stereo amplifier, which is added to the dry guitar sound.

The powered speaker system of the present application enables a musical instrument amplifier (e.g., a guitar amp) to react to a player's input as if no wet effects were being employed, even while wet audio effects are being used. Moreover, the powered speaker system of the present application supports customizing the ratio of the dry signal to wet signal, and ensures that the ratio remains constant during use. For example, as a guitar player lowers volume output at the instrument, at the amplifier or both, such as in order to reduce distortion and "clean up" the amplifier's sound, the wet effects signal changes proportionally to the amplifier's output signal. This can also occur as function of playing style, such as by varying picking, strumming, hammering or other dynamic playing techniques. The solutions provided by the present application will be well-recognized by players who have used traditional amplifiers, such as those configured with built-in reverb, and in which a reverb effect is minimized or disappears completely as volume or tonal quality (e.g., selecting a different pickup in an instrument) is changed. This is experienced, for example, as a player alternates his/her instrument for lead guitar playing and rhythm guitar playing. The tonal qualities produced by effects that would otherwise be negatively affected during play, are instead maintained by the powered speaker of the present application.

The present application combines features in a self-contained powered speaker system that provides studio-quality audio output and that requires only an external amplifier and an external effects unit to operate with a musical instrument. The powered speaker system of the present application eliminates the need for additional costly and inconvenient components that would be otherwise needed to enjoy similar wet/dry/wet audio output. This results in space, time and financial savings.

Referring now to the drawings, in which like reference numerals refer to like elements, FIG. 1 is a block diagram illustrating an arrangement 100 that includes a powered speaker system 102, an external audio amplifier 104 (through which instrument 105 connects), and an external effects unit 106. The external audio amplifier 104 can be virtually any musical instrument amplifier. The effects unit 106 can include wet effects or virtually any other audio effect device(s) desired by the player.

In the example implementation shown in FIG. 1, the powered speaker system 102 includes an audio splitter 108, which can be configured as or to include a control potentiometer and operates to split the audio signal and control of a portion of the dry audio signal received from the amplifier 104. A portion of the dry audio signal received from the amplifier 104 is used to drive at least one dedicated speaker 110. Further, the splitter 108 provides an "effects send level" that is sent to an output jack (e.g., an "effects send line out" jack 304 (FIG. 3))). In addition, the powered speaker system 102 shown in FIG. 1 includes a stereo amplifier 112, which is configured to receive output from the effects unit 106. The stereo amplifier 112 can be a solid-state amplifier (e.g., 2×90 or other W RMS), and can be mounted inside the powered speaker system 102 and, accordingly, not user accessible. Further and as illustrated in FIG. 1, the stereo amplifier 112 amplifies the output signal from the effects unit 106 and drives dedicated speaker(s) 114, for example, one per stereo channel. Thus, apart from the instrument 105, amplifier 104 and the effects unit 106, all of the necessary components and interfaces can be configured to be contained in the powered speaker system 102.

In one or more implementations, the powered speaker system 102 can include a passive power attenuator that is built into the circuit (not shown). The passive power attenuator allows the user to increase volume on the amplifier 104, and simultaneously reduce the output volume of the dry signal at the powered speaker system 102 and output to speaker 110. This provides a beneficial arrangement because, as noted herein, many tube amplifiers need to be turned up extremely loud to achieve a high quality tone and sound. The attenuator allows users to reduce the volume at the speaker, without having to turn down the amplifier, thereby preserving the high quality tone and sound from the dry signal.

Figure 2A:
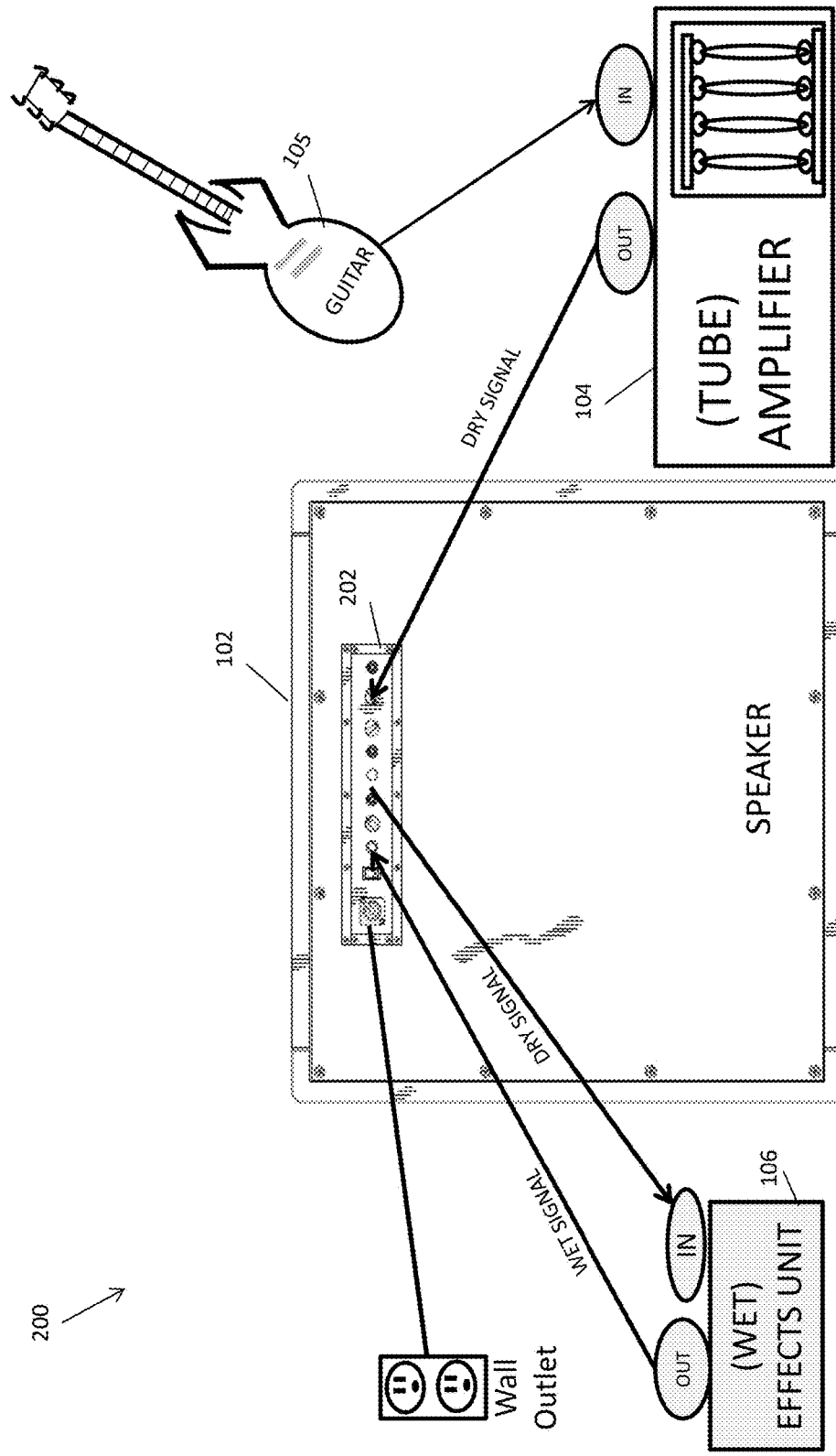
FIG. 2A illustrates an arrangement and shows a rear view of the powered speaker system in accordance with an implementation of the present application.

FIG. 2A illustrates an arrangement 200 and shows a rear view of the powered speaker system 102 in accordance with an implementation of the present application. Interface portion 202 includes inputs and outputs for receiving an audio signal from amplifier 104 and for sending and receiving audio signals to/from effects unit 106. As illustrated in FIG. 2A, guitar 105 connects to the input of amplifier 104, and a dry signal from amplifier 104 (including as modified by a power amp distortion) is sent from the output of amplifier 104 to speaker input in the powered speaker system 102. In addition, a portion of the dry signal is transmitted from the powered speaker system 102 output to an input of the effects unit 106. The signal is modified via the effects unit 106, and the wet signal is sent via an output of the effects unit 106 to an input in the powered speaker system 102.

Figure 2B:
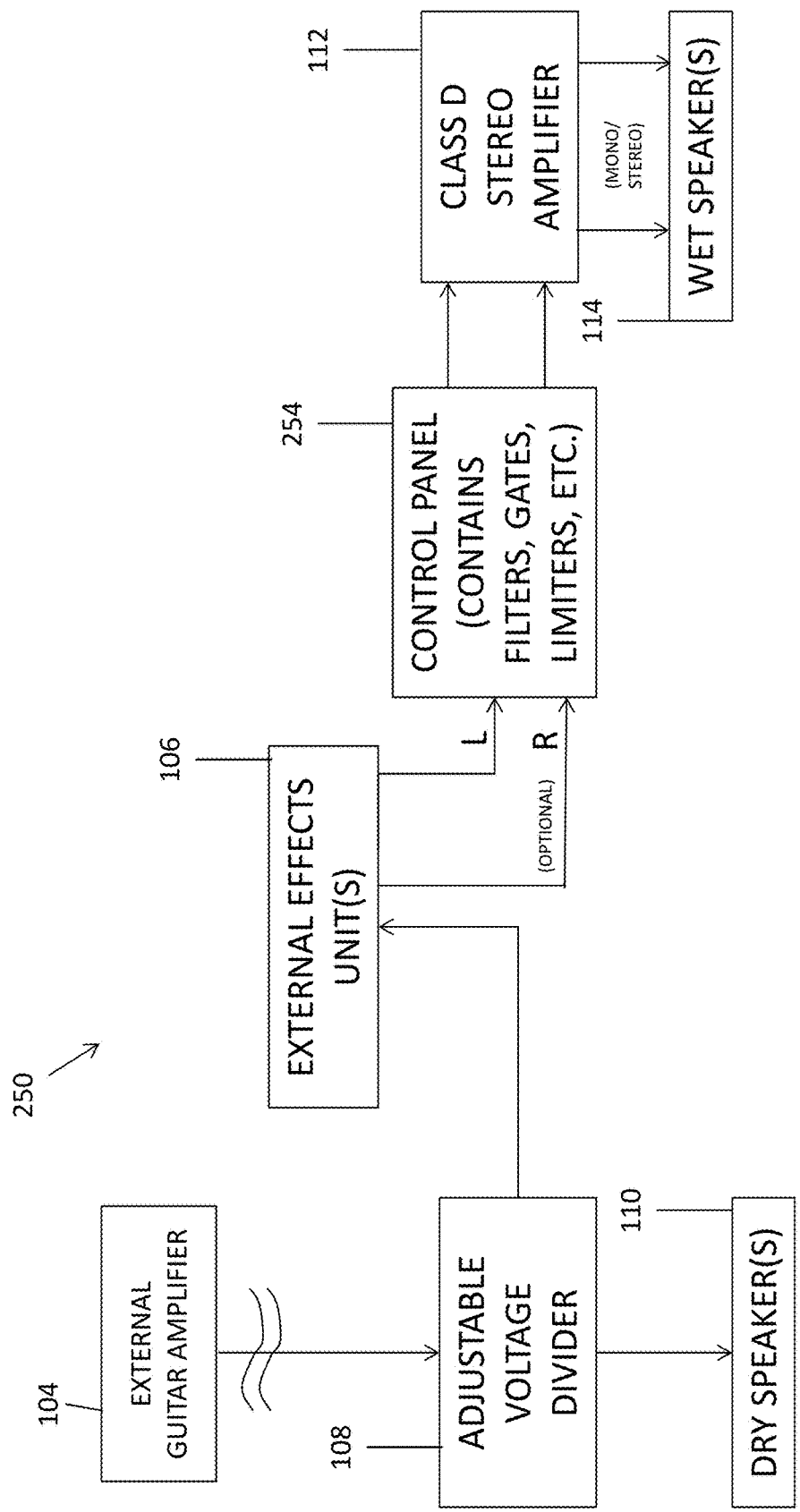
FIG. 2B is a block diagram illustrating modules and signal paths in connection with a collection, in accordance with an example implementation.

FIG. 2B is a block diagram illustrating modules and signal paths in connection with a collection 250, in accordance with an example implementation. An output signal is received by adjustable voltage divider 108 from amplifier 104. A portion of the signal is received by dry speaker(s) 110, and another portion of the signal is received by external effects unit 106. A stereo or monaural ("mono") signal is transmitted from the effects unit 106 to control panel 254. In one or more implementations, control panel 254 can include filters, gates, and limiters, such as described below. Other components can be included, such as lighting (e.g., light emitting diodes ("LED"), a "kill" switch, jacks (e.g., for a foot pedal), and a bass cut). The signal from the control panel 254 is sent to the class D amplifier 112 (which can be configured as a stereo amplifier), and the amplifier 112 sends the amplified signal to wet speaker(s) 114.

Figure 3:
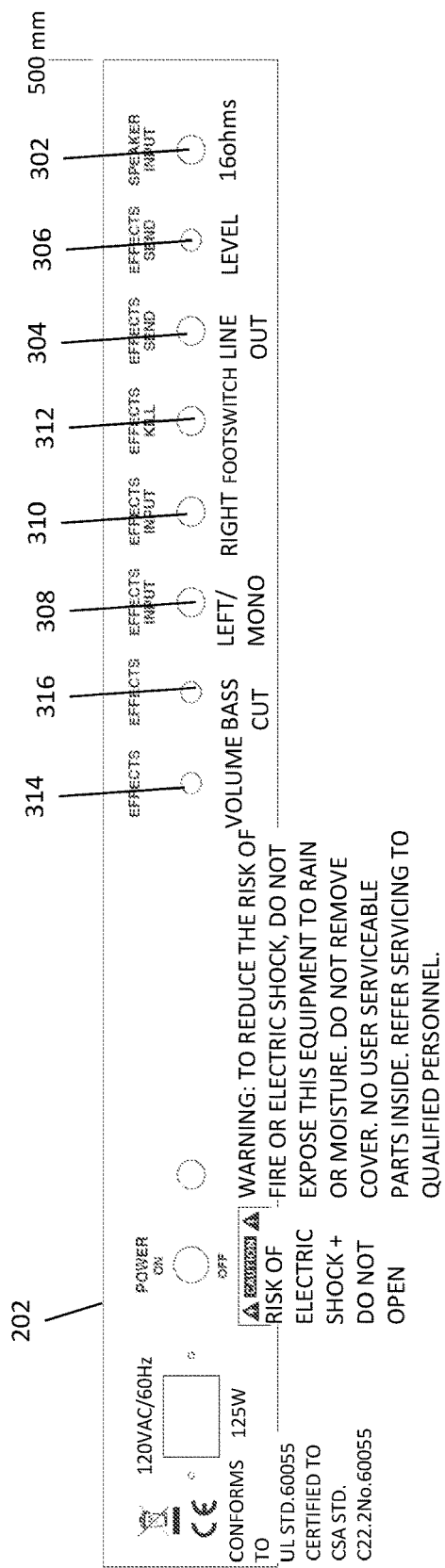
FIG. 3 illustrates an example interface, which is configured with an example implementation the powered speaker system of the present application.

Referring now to FIG. 3, an illustration of an example interface 202 is provided, which is configured with the powered speaker system 102. As illustrated in FIG. 3, speaker input jack 302 is usable to connect the powered speaker system 102 to the output of amplifier 104, and receive the dry output signal. In the example illustrated in FIG. 3, the speaker input jack 302 is configured for 16 ohms impedance, although other impedance ratings can be supported. Effects send line out jack 304 is usable to connect the powered speaker system 102 to effects unit 106, in order to output a portion of the dry signal received from speaker input jack 302 for wet effects processing.

In the implementation illustrated in FIG. 3, effects send level knob 306 can be used as a control to increase or decrease the level of the portion of the dry signal that is output to the effects unit 106 via jack 304. In addition, two effects input jacks (308, 310) are illustrated and usable to connect the powered speaker system 102 to the effects unit 106 and receive output therefrom. Input jack 308 is usable for receiving the left stereo channel only, while jack 310 is usable for receiving the right stereo channel. Use of jack 308 solely results in the two channels of the powered speakers system's 102 internal stereo amplifier 112 operating in a bridged mode.

Other controls configured in the example interface 202 illustrated in FIG. 3 include effects kill input jack 312, which is connectable, for example, to a foot switch to instantly remove any wet effects received by the powered speaker system 102 from being output to speakers 114. This option permits the player to silence the amplifier 112 of the powered speaker system 102 via an external on/off footswitch, for example, in case no wet effects are desired.

Further, effects level control 314 is illustrated, which is operable as a volume control for the powered speaker system's 102 amplifier 112. The more volume the user provides via control 314, the more effects signal is output to speakers 114, relative to the dry guitar signal output to speaker 110. Moreover, effects control 316 is usable to reduce and/or remove the amount of low (e.g., bass) frequencies that are received from the effects unit 106. This option enables players to reduce, remove or add frequencies, in order to improve the quality of the total output from the powered speaker system 102 even further.

Figure 4:
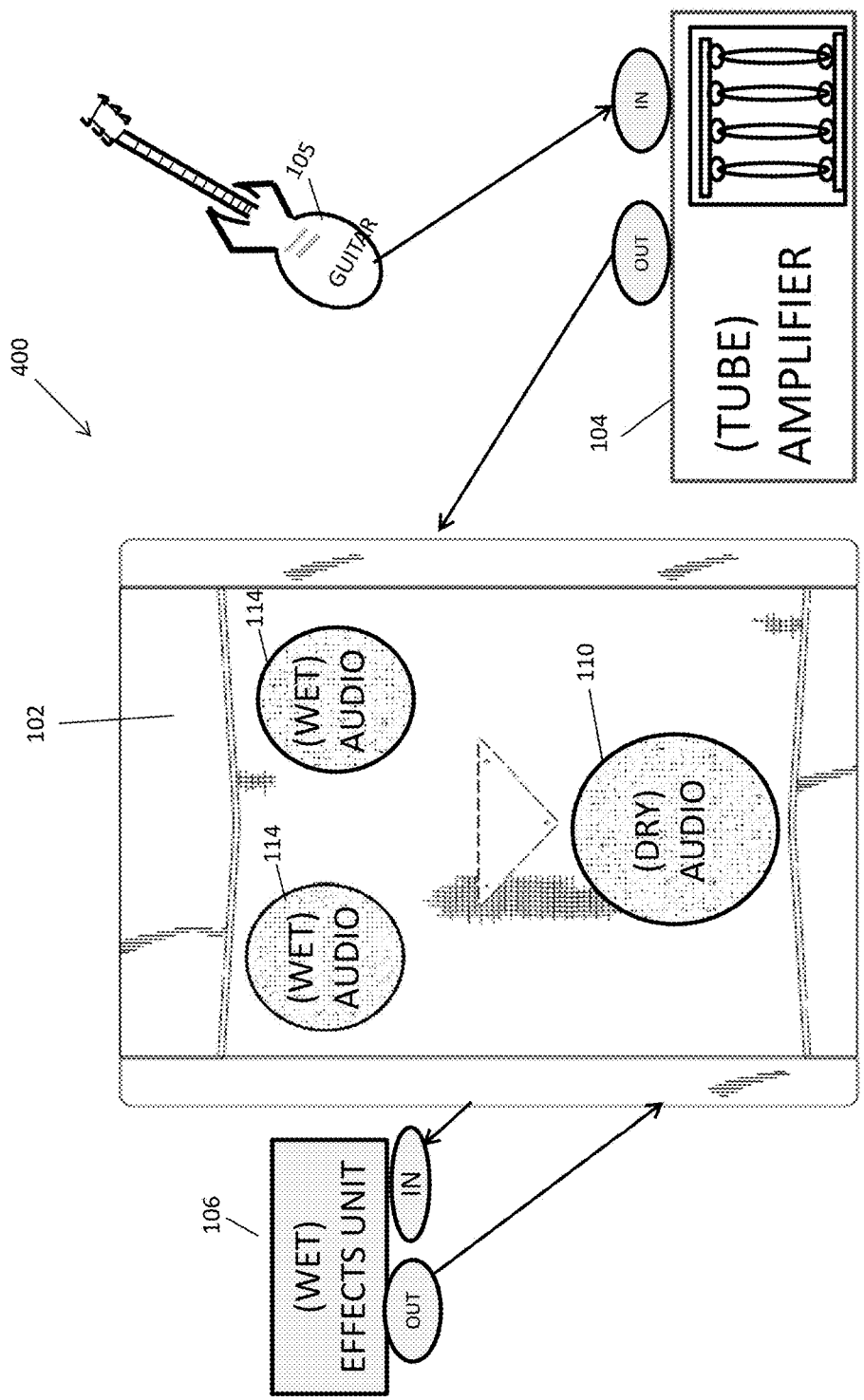
FIG. 4 illustrates an arrangement and shows a front view of an example powered speaker system in accordance with an implementation of the present application.

FIG. 4 illustrates an arrangement 400 and shows a front view of the powered speaker system 102 in accordance with an implementation of the present application. As illustrated in FIG. 4, guitar 105 connects to the input of amplifier 104, and a dry signal from amplifier 104 (including as modified by power amp distortion) is sent from the output of amplifier 104 to a speaker input, configured in the powered speaker system 102. In addition, a portion of the dry signal is transmitted from the powered speaker system 102 output to an input of the wet effects unit 106. The signal is modified via the wet effects unit 106, and the wet signal is sent via an output of the wet effects unit 106 to an input in the powered speaker system 102. Further, FIG. 4 illustrates dual speaker drivers 114 that output wet audio signals from stereo amplifier 112, as well as speaker driver 110, that outputs the unadulterated dry audio signal received from the amplifier 104.

Figure 5:
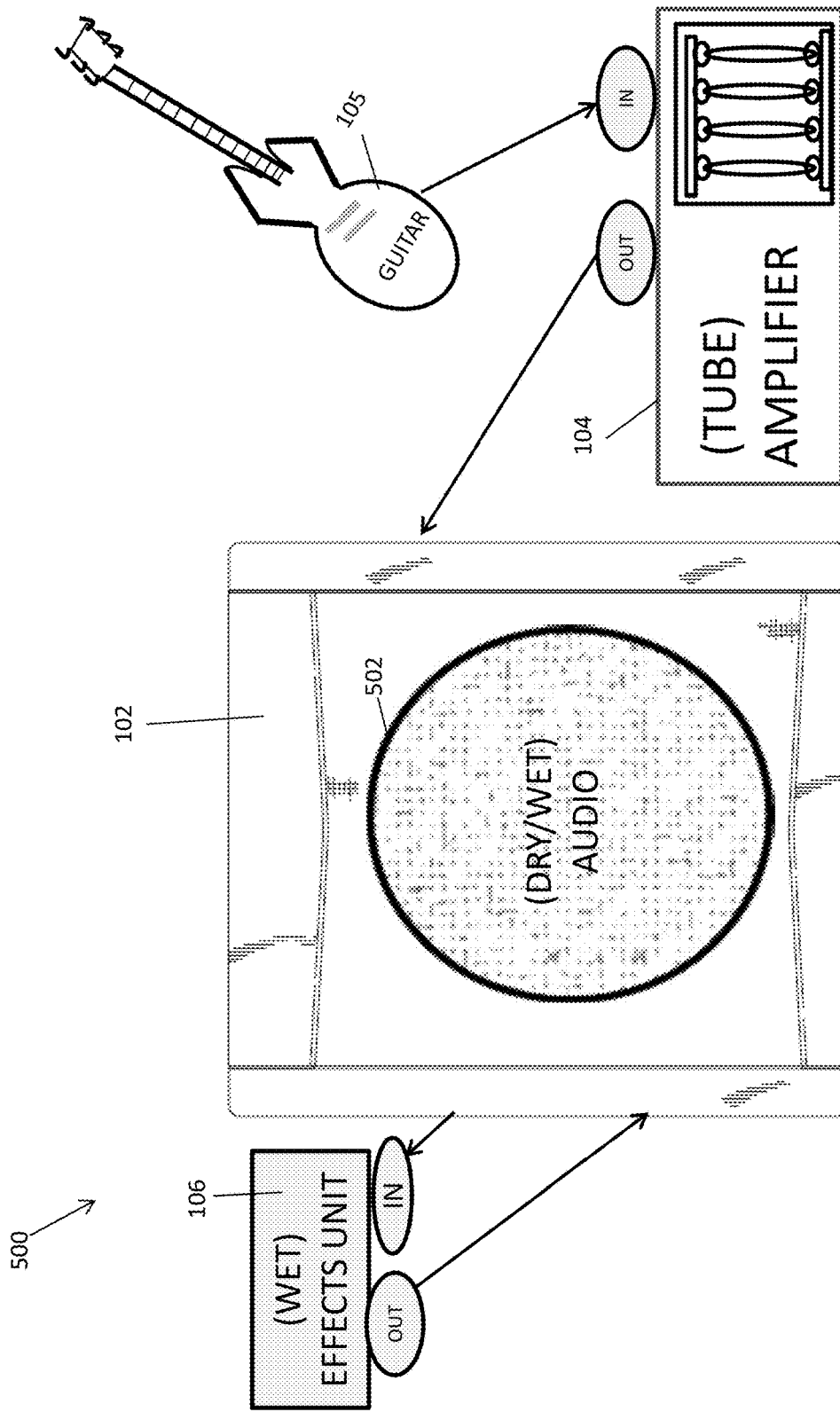
FIG. 5 illustrates an arrangement and shows an example front view of a powered speaker system in accordance with an alternative implementation of the present application.

FIG. 5 illustrates an arrangement 500 and shows a front view of the powered speaker system 102 in accordance with an alternative implementation of the present application. As illustrated in FIG. 5, guitar 105 connects to the input of amplifier 104, and a dry signal from amplifier 104 (including as modified by power amp distortion) is sent from the output of amplifier 104 to a speaker input, configured in the powered speaker system 102. In addition, a portion of the dry signal is transmitted from the powered speaker system 102 output to an input of the wet effects unit 106. The signal is modified via the wet effects unit 106, and the wet signal is sent via an output of the wet effects unit 106 to an input in the powered speaker system 102. Further, FIG. 5 illustrates just a single speaker driver 502, which outputs a pre-mixed audio signal that includes the dry audio signal received from the amplifier 104 and the wet effects output from amplifier 112. In the implementation illustrated in FIG. 5, one or more additional components or modules can be configured with the powered speaker system 102 (not shown). For example, internal mixing components and/or controls can be configured with the powered speaker system 102 in order to provide a pre-mixed and balanced output of the dry and wet effects signals.

Thus, as shown and described herein, the present application provides a solution to enable output from an amplifier (such as a tube amplifier) to react to player playing an instrument connected to the amplifier as if no wet effects were being used at all. The present application provides a new way for a player to experience the "feel" and dynamic range of the amplifier, while still enjoying the benefits of wet effects processing, substantially in real time. This is provided as a function of the "wet" section of the powered speaker system 102, which simply applies effects to the already completed guitar sound via a separate output channel (or the same output channel, in certain implementations). The sound of the two sources are blended in a desirable way to provide a new single source, which enhances wet effects, such as room/space simulating effects including reverb and delay/echo, greatly.

Yet another benefit realized by the present application regards the wet part of the signal, which reacts to player input in the same way as the dry part does. For example, as the player reduces volume at the guitar or the amplifier, e.g., for quieter playing or to reduce overdrive, the effects level is correspondingly reduced as a function of being fed from a proportional signal being split from the amplifier's 105 output. This allows the player to employ the full dynamic range of the amplifier (s)he is using, without the effects level either getting lost or intruding on the dynamic range of the amplifier 105.

Another benefit of the present application is that the quality and uniqueness of the audio output of powered speaker system 102 is dependent, at least in part, on the external amplifier that is used in conjunction therewith. For example, the audio output of the system 102 can vary dramatically, for example, whether a FENDER amplifier, a VOX amplifier, or a MARSHALL amplifier is used, to name but a few. By providing a powered speaker system 102 as shown and described herein, the nature of the sound emitting therefrom can alter significantly by the external amplifier. Moreover, in one or more implementations, the powered speaker system 102 can be configured with a plurality of amplifier (e.g., "speaker") inputs (not shown), and an internal switching circuit can be included that enables a user to attach (e.g., "plug-in") a plurality of different amplifiers, and simply switch between the amplifiers to cause the powered speaker system 102 to vary dramatically during use. For example, while playing rhythm guitar, a first amplifier can be selected, and while playing lead guitar, a different amplifier can be selected. Moreover, different amplifiers can be selected for different songs, such as to better emulate the sound of a particular song or artist in real-time.

Depending upon a specific implementation of the present application, one or more discrete components can be used and configured for obtaining a high quality audio signal. Such components and respective configurations are effective to reduce or eliminate unwanted audio effects, such as caused by sound distorting, oscillating, or feeding back. Such unwanted audio effects can occur for various reasons, such as the positioning of speaker drivers, the design of the cabinet (e.g., open/closed back, size of the cabinet), and types of speakers that have different resonance frequencies, can all result in sounds that are undesirable.

For example and in connection with the example implementation 400 shown in FIG. 4, it is recognized by the inventor that the speakers inside the system 102 interact, particularly when operating at a high volume. For example, as speakers move in one direction (e.g., they move out), a vacuum is created. Alternatively, as speakers move in the other direction (e.g., they move in) pressure is created. Such movement excites the speakers and can result in unintended audio, such as feedback. Such interaction creates electricity (e.g., "flyback" voltage) in the voice coil.

For example, at a respective frequency, such as 630 Hz, distortion/oscillation is detected. At a different frequency, say 650 Hz, there is no such distortion/oscillation. A notch filter can be included to attenuate the decibel output by an amount, such as 5 decibels, 10 decibels, 20 decibels, or other suitable amount. The notch filter effectively reduces the amplitude of the respective frequency, thus keeping the frequency under a level that would create the undesired output.

Another undesirable audio effect can occur as a result of latent movement, such as when the wet speaker(s) 114 continue movement after the input signal abruptly terminates. For example, a guitarist strikes a string sharply, and then mutes the string immediately thereafter. To prevent wet speaker 114 latency, for example, one or more gates can be included to block the signal, such as the flyback voltage. In one or more implementations, the gate can be placed in the return path, to enable the wet effects to terminate naturally, thereby providing a more natural and pleasing audio effect.

In one or more implementations, a frequency limiter can be included to limit an upper frequency range, such as to provide a power savings by eliminating frequencies above an amount for a respective instrument, such as an electric guitar.

Accordingly, the present application provides for "wet/dry" (e.g., mono wet and mono dry) or "wet/dry/wet" (e.g., stereo wet and mono dry) rigs that are extremely easy to configure and use, and eliminates complicated external and extraneous (and often expensive) hardware that would otherwise be necessary to achieve similar albeit not identical functionality. The present application eliminates a need for extra amplifier(s), mixing consoles, speaker cabinets, wires, cables and/or devices that require space, which is often at premium on small stages and venues. Further, the present application eliminates a need for a sound engineer to place separate microphones on the dry speaker(s) 110 and wet speaker(s) 114, and thereafter mix the signals to correct or desired proportions. The present application handles such mixing completely with the powered speaker system 102, and one or more microphones can be placed away from the speakers in order to provide the properly mixed output to a public address ("PA") system, recorder, or other suitable input device.

In one or more alternative implementations, the present application can include a powered speaker system that does not provide a dry output sound, and instead provides only wet effects of an input signal, such as received from a musical instrument amplifier. In this alternative implementation, the received signal from the amplifier is not split into two or more portions and, instead, the received signal is attenuated and the attenuated signal is sent as an "effects send level" that is sent to an output jack (e.g., an "effects send line out" jack 304 (FIG. 3))). The powered speaker system of this alternative implementation can include the stereo amplifier 112, which is configured to receive output from the effects unit 106, and which can be a solid-state amplifier (e.g., 2×90 or other W RMS), and can be mounted inside the powered speaker system. Continuing with this alternative implementation, the stereo amplifier amplifies the output signal from the effects unit and speaker(s), for example, one per stereo channel. Thus, a "wet" only powered speaker system can be provided via an alternative implementation.

Moreover, in one or more implementations, the powered speaker system of the present application can be configured with a cabinet having a closed back (e.g., not accessible) or an open back (or partially open back), being partially accessible.

Although illustrated embodiments of the present invention have been shown and described, it should be understood that various changes, substitutions, and alterations can be made by one of ordinary skill in the art without departing from the scope of the present invention.

What is claimed is:

1. A powered speaker system, comprising:
 a cabinet;
 an amplifier input, configured in the cabinet and accessible to a user, to receive an audio signal from an external amplifier that is not configured in the cabinet;
 an audio splitter, that is configured in the cabinet, that receives and splits the audio signal from the external amplifier into first and second portions;
 at least one first speaker driver, configured in the cabinet, that receives the first portion of the split audio signal from the audio splitter;
 an effects output jack, configured in the cabinet, that receives from the audio splitter the second portion of the split audio signal and is connectable to an external effects device;
 an effects input jack, configured in the cabinet, that is connectable to the external effects device, and that receives, from the external effects device, the second portion of the split audio signal that is modified by the external effects device;
 an internal amplifier, configured in the cabinet, that is coupled to the effects input jack and that receives and amplifies only the modified second portion of the split audio signal; and
 at least one second speaker driver, configured in the cabinet, that receives from the internal amplifier, the amplified modified second portion of the split audio signal,
 wherein the first speaker driver of the powered speaker system outputs the first portion of the split audio signal simultaneously while the second speaker driver of the power speaker system outputs the amplified modified second portion of the split audio signal.

2. The powered speaker system of claim 1, further comprising at least one attenuator to attenuate the audio signal from the external amplifier.

3. The powered speaker system of claim 2, wherein attenuating the audio signal from the external amplifier provides for independent volume control of the output first portion and the amplified modified second portion.

4. The powered speaker of claim 1, further comprising a plurality of amplifier inputs, configured in the cabinet and accessible to the user, to receive respective audio signals from a plurality of respective external amplifiers that are not configured in the cabinet.

5. The powered speaker system of claim 4, further comprising a switch for selecting one of the respective audio signals from one the respective external amplifiers for receiving the audio signal.

6. A powered speaker system, comprising:
 a cabinet;
 an amplifier input, configured in the cabinet and accessible to a user, to receive an audio signal from an external amplifier that is not configured in the cabinet;
 an audio splitter, that is configured in the cabinet, that receives and splits the audio signal from the external amplifier into first and second portions;
 a speaker driver, configured in the cabinet, that receives the first portion of the split audio signal from the audio splitter;
 an effects output jack, configured in the cabinet, that receives from the audio splitter the second portion of the split audio signal and is connectable to an external effects device;
 an effects input jack, configured in the cabinet, that is connectable to the external effects device, and that receives, from the external effects device, the second portion of the split audio signal that is modified by the external effects device; and
 an internal amplifier, configured in the cabinet, that is coupled to the effects input jack and that receives and amplifies only the modified second portion of the split audio signal and that sends the amplified modified second portion of the split audio signal to the speaker driver,
 wherein the speaker driver of the powered speaker system outputs the first portion of the split audio signal simultaneously with the amplified modified second portion of the split audio signal.

7. The powered speaker system of claim 6, further comprising at least one attenuator to attenuate the audio signal from the external amplifier.

8. The powered speaker system of claim 7, wherein attenuating the audio signal from the external amplifier provides for independent volume control of the output first portion and the amplified modified second portion.

9. The powered speaker of claim 6, further comprising a plurality of amplifier inputs, configured in the cabinet and accessible to the user, to receive respective audio signals from a plurality of respective external amplifiers that are not configured in the cabinet.

10. The powered speaker system of claim 9, further comprising a switch for selecting one of the respective audio signals from one the respective external amplifiers for receiving the audio signal.

11. A method for providing an audio output, comprising:
receiving, by an amplifier input configured in a cabinet and accessible to a user, an audio signal from an external amplifier that is not configured in the cabinet;
receiving, by an audio splitter that is configured in the cabinet, the audio signal from the external amplifier;
splitting, by the audio splitter, the audio signal into first and second portions;
receiving, by at least one first speaker driver configured in the cabinet, the first portion of the split audio signal from the audio splitter;
receiving, from the audio splitter by an effects output jack configured in the cabinet, the second portion of the split audio signal;
receiving, from an external effects device via an effects input jack that is connectable to the external effects device, the second portion of the split audio signal that is modified by the external effects device;
receiving and amplifying, by an internal amplifier configured in the cabinet, only the modified second portion of the split audio signal;
receiving, from the internal amplifier by at least one second speaker driver configured in the closed cabinet, the amplified modified second portion of the split audio signal,
wherein the first speaker driver of the powered speaker system outputs the first portion of the split audio signal simultaneously while the second speaker driver of the power speaker system outputs the amplified modified second portion of the split audio signal.

* * * * *